(12) United States Patent
Ogashiwa et al.

(10) Patent No.: US 12,000,019 B2
(45) Date of Patent: Jun. 4, 2024

(54) GOLD POWDER, PRODUCTION METHOD FOR GOLD POWDER, AND GOLD PASTE

(71) Applicant: TANAKA KIKINZOKU KOGYO K.K., Tokyo (JP)

(72) Inventors: Toshinori Ogashiwa, Isehara (JP); Masayuki Miyairi, Hiratsuka (JP)

(73) Assignee: TANAKA KIKINZOKU KOGYO K.K., Tokyo (JP)

(*) Notice: Subject to any disclaimer, the term of this patent is extended or adjusted under 35 U.S.C. 154(b) by 0 days.

(21) Appl. No.: 17/632,221

(22) PCT Filed: Jul. 20, 2020

(86) PCT No.: PCT/JP2020/028007
§ 371 (c)(1),
(2) Date: Feb. 1, 2022

(87) PCT Pub. No.: WO2021/024769
PCT Pub. Date: Feb. 11, 2021

(65) Prior Publication Data
US 2022/0219237 A1    Jul. 14, 2022

(30) Foreign Application Priority Data
Aug. 5, 2019    (JP) .................................. 2019-144018

(51) Int. Cl.
| B22F 9/18 | (2006.01) |
| B22F 1/00 | (2022.01) |
| B22F 1/05 | (2022.01) |
| B22F 1/0545 | (2022.01) |
| B22F 1/10 | (2022.01) |
| B22F 1/145 | (2022.01) |
| B23K 35/30 | (2006.01) |
| B29C 65/02 | (2006.01) |
| C22C 1/04 | (2023.01) |

(52) U.S. Cl.
CPC .............. *C22C 1/0466* (2013.01); *B22F 1/00* (2013.01); *B22F 1/05* (2022.01); *B22F 1/0545* (2022.01); *B22F 1/10* (2022.01); *B22F 1/145* (2022.01); *B22F 9/18* (2013.01); *B23K 35/3013* (2013.01); *B29C 65/02* (2013.01); *B22F 2301/255* (2013.01)

(58) Field of Classification Search
None
See application file for complete search history.

(56) References Cited

U.S. PATENT DOCUMENTS

| 2009/0230172 A1 | 9/2009 | Ogashiwa et al. |
| 2009/0309459 A1 | 12/2009 | Ogashiwa et al. |
| 2012/0212106 A1 | 8/2012 | Ogashiwa et al. |
| 2013/0168437 A1 | 7/2013 | Miyairi et al. |
| 2014/0026714 A1* | 1/2014 | Murphy ................. B22F 9/16 422/187 |
| 2015/0290714 A1* | 10/2015 | Lee ......................... B22F 1/056 75/371 |
| 2018/0044175 A1 | 2/2018 | Ogashiwa et al. |
| 2018/0151531 A1 | 5/2018 | Miyairi et al. |
| 2020/0230701 A1 | 7/2020 | Ogashiwa et al. |

FOREIGN PATENT DOCUMENTS

| EP | 2 626 893 A1 | 8/2013 |
| JP | H09-20903 A | 1/1997 |
| JP | 2008-028364 A | 2/2008 |
| JP | 4360646 B2 | 11/2009 |
| JP | 4638382 B2 | 2/2011 |
| JP | 2012-087398 A | 5/2012 |
| JP | 5065718 B2 | 11/2012 |
| JP | 5205714 B2 | 6/2013 |
| JP | 5613253 B2 | 10/2014 |
| JP | 5931246 B1 | 11/2016 |
| JP | 2018-021246 A | 2/2018 |
| JP | 2018-182068 A | 11/2018 |
| WO | WO-2012/046641 A1 | 4/2012 |

OTHER PUBLICATIONS

International Searching Authority, "International Search Report," issued in connection with International Patent Application No. PCT/JP2020/028007, dated Sep. 24, 2020.

International Searching Authority, "Written Opinion," issued in connection with International Patent Application No. PCT/JP2020/028007, dated Sep. 24, 2020.

Office Action issued in corresponding Chinese Patent Application No. 202080054638.7 dated Apr. 26, 2023 (24 pages).

Office Action issued in corresponding Japanese Patent Application No. 2019-144018, dated Aug. 21, 2023.

Korean Office Action issued in connection with KR Appl. Ser. No. 10-2022-7000789 dated Apr. 7, 2023.

Extended European Search Report issued in corresponding European Patent Application No. 20849546.5, dated Jul. 22, 2022.

Office Action issued in corresponding Japanese Patent Application No. 2019-144018, dated Feb. 28, 2023.

(Continued)

*Primary Examiner* — George Wyszomierski
(74) *Attorney, Agent, or Firm* — Foley & Lardner LLP

(57) ABSTRACT

A gold powder comprising gold having a purity of 99.9% by mass or more and having an average particle size of 0.01 μm or more and 1.0 μm or less, a content of a chloride ion is 100 ppm or less, and a content of a cyanide ion is 10 ppm or more and 1000 ppm or less. A total of the content of a chloride ion and the content of a cyanide ion is preferably 110 ppm or more and 1000 ppm or less. The gold powder has improved adaptability to various processes including bonding or the like with a content of a chloride ion, that is, an impurity, optimized. A gold paste using this gold powder is suitably used in various uses for bonding such as die bonding of a semiconductor chip, sealing a semiconductor package, and forming an electrode/wire.

14 Claims, No Drawings

(56) References Cited

OTHER PUBLICATIONS

Office Action issued in corresponding European Patent Application No. 20849546.5, dated Jun. 23, 2023.
Office Action issued in corresponding Korean Patent Application No. 10-2022-7000789 dated Oct. 24, 2023 (5 pages).

* cited by examiner

GOLD POWDER, PRODUCTION METHOD FOR GOLD POWDER, AND GOLD PASTE

CROSS-REFERENCE TO RELATED APPLICATIONS

The present application claims priority under 37 U.S.C. § 371 to International Patent Application No. PCT/JP2020/028007, filed Jul. 20, 2020, which claims priority to and the benefit of Japanese Patent Application No. 2019-144018, filed on Aug. 5, 2019. The contents of these applications are hereby incorporated by reference in their entireties.

BACKGROUND OF THE INVENTION

Field of the Invention

The present invention relates to a gold powder and a gold paste suitable for uses for bonding, sealing, forming an electrode/wire, and the like in the field of electronics.

Description of the Related Art

The present applicant has disclosed usefulness, in the field of electronics, of a metal powder with a submicron order size (1 μm or less) containing gold (Au), silver (Ag) or the like having a high purity (of 99.9% by mass or more) (for example, Patent Documents 1 to 6). Such a high purity and fine metal powder can be advantageously sintered at a low temperature, and hence is effective in bonding, sealing, and forming an electrode (bump)/wire in various uses for electronic components, semiconductor devices, power devices, and MEMSs.

For example, bonding such as die bonding of a semiconductor chip on a substrate or flip chip bonding can be performed at a temperature lower than that employed in using a conventional brazing material (such as a AuSn-based brazing material). In a bonding method using such a metal powder, a metal paste containing the metal powder and an organic solvent is applied to one bonding member, and the metal paste is sintered at a prescribed temperature to obtain a metal powder sintered body. The one bonding member and the other bonding member are overlapped on each other via the thus obtained metal powder sintered body, and the resultant is heated, a pressure is applied in one direction or both directions, and thus, the bonding is completed (Patent Document 1). In this bonding method, the metal powder sintered body formed by sintering the metal paste works as a bonding medium similar to the conventional brazing material. This metal powder sintered body can be formed at a relatively low temperature (300° C. or less), and is densified when heated at 300° C. or less with a pressure applied also at the time of bonding. Therefore, bonding can be performed without concern for heat loss of a substrate, a semiconductor chip or the like caused by heat or thermal stress. It is noted that the present applicant has disclosed a metal paste for such bonding use containing the metal powder and a prescribed organic solvent and having suitable properties (Patent Document 7).

The high purity and fine metal powder is useful also for sealing in production of a semiconductor package or the like. In the sealing, the metal powder is formed into a metal paste, and the metal paste is used as a sealant. The sealing is performed by bonding a base material holding a semiconductor device or the like thereon to a lid body (cap material) for the base material. In this sealing process, the metal paste is applied to the base material or the lid body, and thereafter the metal paste is sintered to obtain a metal powder sintered body in the same manner as in the bonding method described above. Then, the base material and the lid body are bonded to each other via the metal powder sintered body, and thus, the sealing is completed (Patent Document 2). The metal powder of the metal powder sintered body formed on the base material or the lid body is densified through rigid bond while plastically deformed with a pressure applied to form a bonding portion close to a bulk state. A region surrounded by this bonding portion is hermetically sealed. Regarding such a sealing method, it has been proposed that a metal thin film or a core material is disposed in a portion where a sealant is to be formed to accelerate densification of the sealant (Patent Documents 3 and 4).

Besides, the high purity and fine metal powder is effective also for formation of an electrode (bump) or a wire (Patent Document 5). Gold and silver are good conductors, and high purity metal powders of these metals can be materials of an electrode/wire when formed into a sintered body. When the metal powder is used as a material of an electrode/wire, a metal paste of the metal powder is applied to a base material having been subjected to resist process if necessary, and the resultant metal powder is sintered to form an electrode/wire. In using the metal powder as the material of an electrode/wire, a method in which a sintered body (metal wire material) of the metal powder is formed in a desired form/pattern on a target substrate (substrate to be transferred) and another substrate (transferring substrate) in advance, and the transferring substrate and the substrate to be transferred are overlapped on each other in an opposing manner to transfer the metal wire material by applying a pressure can be employed (Patent Document 6).

In this manner, the high purity and fine metal powder proposed by the present applicant is effective in process of bonding, sealing, and forming an electrode/wire in various products of the field of electronics. As a production method for this metal powder, a method basically employing a wet reduction method is known. In the wet reduction method, a reducing agent is added to a metal compound solution to deposit/precipitate a metal particle. In the metal powder, not only the purity but also the particle size is significant, and hence a method described in Patent Document 8 may be employed as a method in which a particle size can be controlled in the wet reduction method. In this production method for the metal powder, a reducing agent and a gold compound solution are supplied to a solution in which gold ultrafine particles are dispersed as a nuclear particle, and thus, gold is deposited on the surface of the gold ultrafine particle (nuclear particle). In this method, the particle size and the number of nuclear particles, and a concentration and an amount of the gold compound solution to be supplied are adjusted to produce a submicron order gold powder.

PRIOR ART DOCUMENT

Patent Document

[Patent Document 1] Japanese Patent No. 4638382
[Patent Document 2] Japanese Patent No. 5065718
[Patent Document 3] Japanese Patent Application Laid-Open No. 2018-182068
[Patent Document 4] Japanese Patent No. 5931246
[Patent Document 5] Japanese Patent No. 4360646
[Patent Document 6] Japanese Patent No. 5205714
[Patent Document 7] Japanese Patent No. 5613253
[Patent Document 8] Japanese Patent Application Laid-Open No. 9-20903

SUMMARY OF THE INVENTION

Technical Problem

According to the findings of the present applicant, a requirement for restriction of an impurity content in the above-described submicron order metal powder is increasing. As described above, in the production process of the metal powder by the wet reduction method, the particle size is adjusted by reduction of a metal compound (gold compound) solution. As the gold compound, a chloride such as chloroauric acid is used in many cases, and a chloride ion remains in the gold powder thus produced. In the field of electronics where the gold powder is used, a chloride ion is known as an impurity to be avoided. Therefore, in the conventional production process for a metal powder by the wet reduction method, the produced metal powder is washed with a solvent of an alcohol, pure water or the like to reduce a content of a chloride ion.

In recent years, however, it is predicted that the content of a chloride ion is required to be further reduced. This is because low-temperature packaging in which a bonding temperature is set to 250° C. or less is liable to be performed in the die bonding, the flip chip bonding, the hermetical sealing of a package and the like. Under a conventional packaging condition, a bonding portion is formed by bonding, with a pressure applied, a metal powder sintered body at a relatively high temperature. When this condition is employed, even if some amount of a chloride ion remains in the metal powder, it is gasified by heating in the bonding process to be removed. In the bonding process employing the low-temperature packaging, however, a chloride ion is not completely gasified and is liable to remain in the bonding portion. Such a residual chloride ion is changed into an acidic liquid in the presence of water after the packaging, and it is concerned that the acidic liquid may corrode the bonding portion or a wire material.

The present invention was accomplished in such a background, and provides a submicron order metal powder containing gold that is excellent in adaptability to various processes of bonding, sealing, and forming an electrode/wire with a content of a chloride ion corresponding to an impurity optimized. Besides, the present invention also clarifies a production method for a gold powder thus optimized in an impurity content.

Solution to Problem

The present inventors made studies, for solving the above-described problems, on whether or not a chloride ion content can be further reduced in a gold powder produced by a wet reduction method. In the studies, the present inventors tried application of an ion exchange resin, and increase of the number of times of conventional washing with a solvent. As a result, it was confirmed that a content of a chloride ion itself can be reduced by various measures. It was, however, also found that a gold powder cleaned by the various measures may have a problem at a stage of use for bonding or the like.

This problem will be specifically described. In using a gold powder in various uses for bonding and the like, it is necessary to disperse the gold powder in a solvent to obtain a gold paste. According to the studies made by the present inventors, it was confirmed that when a gold powder cleaned by reducing a chloride ion content as compared with a conventional content is formed into a paste, the gold powder has a strong agglomerating property, and hence dispersibility may be lowered or precipitation may be caused before use in some cases.

The present inventors examined a cause of increase of the agglomerating property of the gold powder cleaned by removing a chloride ion, and presumed that an impurity such as a chloride ion acts similarly to a protective agent used for preventing agglomeration of a gold powder. It is predicted that a gold powder corresponding to a target of the present invention has a high purity and hence has a surface in a highly active state. When such high purity gold powder particles come close to or come into contact with one another, the particles are easily bonded to one another to agglomerate. The present inventors presume that the bonding and agglomeration of gold powder particles are inhibited in a conventional gold powder because a chloride ion is present on the surfaces of the particles.

Based on these examinations, a chloride ion contained in a gold powder can be an obstructive factor of low-temperature packaging as well as can be a useful impurity having an agglomeration inhibitory action for the gold powder. It is, however, presumed that the agglomeration inhibitory action for the gold powder is not an action that a chloride ion alone possesses. It is assumed that another ion or element can be present on the surface of a gold powder and prevent contact/bonding between gold powder particles.

Therefore, the present inventors specified an ion/element that has an agglomeration inhibitory action for a gold powder equivalent to that of a chloride ion, and is difficult to obstruct low-temperature packaging differently from a chloride ion, and examined adequate contents of such an ion/element and a chloride ion. As a result of the examination, it was found that a gold powder containing a cyanide ion (CN) with a chloride ion content reduced to a prescribed content or less can exhibit a suitable property, and thus, the present invention was accomplished.

Specifically, the present invention is drawn to a gold powder comprising gold having a purity of 99.9% by mass or more and having an average particle size of 0.01 μm or more and 1.0 μm or less, in which a content of a chloride ion is 100 ppm or less, and a content of a cyanide ion is 10 ppm or more and 1000 ppm or less.

As described above, as a characteristic of the present invention, a gold powder having a high purity and a submicron order particle size contains a cyanide ion with a chloride ion concentration reduced to a prescribed value or less. Therefore, the structure of the gold powder itself is similar to that of a conventional gold powder. Now, the gold powder of the present invention, a metal paste using the same, and various uses of the gold powder of the present invention will be described in detail.

(A) Gold Powder of the Present Invention (i) Purity and Average Particle Size of Gold Powder The gold powder of the present invention is a gold powder containing gold having a purity (gold concentration) of 99.9% by mass or more and having an average particle size of 0.01 μm or more and 1.0 μm or less. The purity of the gold powder needs to be as high as 99.9% by mass or more because thus the gold powder can effectively act as a bonding material or a sealing material. As described above, in bonding or the like with the gold powder of the present invention, a sintered body of the gold powder is formed, and then is compressed with a pressure applied to obtain a dense bonding portion. Here, gold having a low purity has high hardness, is difficult to be plastically deformed with a pressure applied, and hence binding force among gold powder particles is deteriorated. Accordingly, the purity of the gold powder is set to be high for accelerating plastic deformation in bonding, and thus, a dense bonding portion can be formed.

The average particle size of the gold powder is 0.01 μm or more and 1.0 μm or less because a gold powder having a particle size over 1.0 μm has a high sintering temperature, and hence is difficult to use in bonding at a low temperature. Besides, the lower limit is 0.01 μm because the powder easily agglomerates when formed into a paste if the particle size is less than this particle size.

For measuring the average particle size of the gold powder, the gold powder is observed and photographed with a microscope (such as an optical microscope or an electron microscope (SEM or TEM)), particle sizes of a plurality of gold powder particles are measured in the thus obtained photograph or image, and an average of the particle sizes can be defined as the average particle size. In the measurement of a particle size, it is preferable that a major axis and a minor axis of an individual particle are measured to calculate the particle size by a biaxial method. Besides, computer software such as image analysis software may be appropriately used.

(ii) Content of Chloride Ion

In the gold powder of the present invention, a content of a chloride ion is limited to 100 ppm or less. The influence of a chloride ion has been already described, and it is indispensable, in the present invention, to reduce the content of a chloride ion. The upper limit of the content of a chloride ion is 100 ppm because this value is probably an allowable upper limit in consideration of low-temperature packaging using the gold powder of the present invention. A lower limit of the content of a chloride ion is realistically difficult to be reduced to 0 ppm, and is reduced to preferably about 10 ppm.

The content of a chloride ion in the present invention is based on the mass of the gold powder. The content refers to a chloride ion amount not in a specific portion (such as a surface portion, or a center portion) of the individual gold powder particle but in the whole mass of the gold powder appropriately weighed. In measurement of the content of a chloride ion, for example, a heat desorption method is preferably employed. In the heat desorption method, the gold powder is heated to gasify and desorb a chloride ion, and the chloride ion is collected with an appropriate adsorbent liquid to be quantitatively analyzed with a gas chromatograph, a mass spectrometer or the like.

(iii) Content of Cyanide Ion

In the present invention, a prescribed amount of a cyanide ion is imparted to the gold powder. As described above, a gold powder from which all impurities such as a chloride ion have been removed has an agglomerating property increased when formed into a paste. Therefore, an impurity of a cyanide ion is intentionally imparted to the gold powder as a protective agent for inhibiting agglomeration. A cyanide ion is used as the protective agent because a cyanide ion has an agglomeration inhibitory action similarly to a chloride ion and can be desorbed/gasified from the gold powder at a lower temperature than a chloride ion. In other words, when a cyanide ion is appropriately added to the gold powder, agglomeration is difficult to occur in forming a paste, and a cyanide is removed in bonding performed thereafter without leaving an influence as an impurity. The removal of a cyanide ion is started in a drying stage after application of the paste and is completed by heating performed at stages of sintering the gold powder and bonding. At this point, a cyanide ion can be removed even when low-temperature packaging conditions are employed.

The content of a cyanide ion is 10 ppm or more and 1000 ppm or less. In a gold powder in which the content of a chloride ion is reduced, if the content of a cyanide ion is less than 10 ppm, the effect as the protective agent is so small that the agglomerating property cannot be reduced. On the other hand, an upper limit of the content of a cyanide ion is 1000 ppm. A cyanide ion can be desorbed at a relatively low temperature, but is equivalent to a chloride ion in that it is an impurity. Excessive addition of a cyanide ion causes concern that a cyanide ion may remain in a bonding portion or a sealing portion formed from the gold powder. If a cyanide ion remains in a bonding portion or a sealing portion formed from the gold powder, influence similar to that of a chloride ion is caused. In consideration of this, the upper limit of the content of a cyanide ion is set to 1000 ppm.

The content of a cyanide ion in the present invention refers to a cyanide ion amount in the whole mass of the gold powder similarly to the content of a chloride ion. Besides, the heat desorption is preferably employed also for measurement of the content of a cyanide ion.

(iv) Relationship between Content of Chloride Ion and Content of Cyanide Ion

As described above, both a chloride ion and a cyanide ion have the agglomeration inhibitory action for a gold powder. Accordingly, a chloride ion contained within the limited range (100 ppm or less) of the present invention acts as a protective agent together with a cyanide ion. From this point of view, in the present invention, a total of the content of a chloride ion and the content of a cyanide ion is preferably 110 ppm or more and 1000 ppm or less. When the content of a chloride ion is close to the upper limit (100 ppm), the action is effective even if the content of a cyanide ion is reduced. A lower limit of the sum of the content of a chloride ion and the content of a cyanide ion is preferably 120 ppm when the action as the protective agent alone is regarded as significant. When the purity in a bonding portion or a sealing portion is regarded as significant, the lower limit is preferably 110 ppm. Besides, an upper limit of the total of the content of a chloride ion and the content of a cyanide ion is more preferably 500 ppm, and further preferably 300 ppm.

On the other hand, in the present invention, the content of a chloride ion is reduced as much as possible in the gold powder. This is because a chloride ion should be avoided from remaining in a bonding portion formed from the gold powder as compared with obtaining the action as the protective agent. In such a gold powder, the role of a cyanide ion is more significant. As described above, the lower limit of the content of a chloride ion is preferably about 10 ppm. Therefore, in consideration of the preferable range of the total of the content of a chloride ion and the content of a cyanide ion described above, the content of a cyanide ion is preferably 100 ppm or more. Specifically, the content of a cyanide ion in the present invention is preferably 100 ppm or more and 1000 ppm or less.

(v) Other Impurity Elements

The gold powder of the present invention contains incidental impurity elements in addition to a chloride ion and a cyanide ion in some cases. Specific examples of the incidental impurity elements include Na, Al, Fe, Cu, Se, Sn, Ta, Pt, Bi, Pd, S, Ag, Br, and Si. A total amount of the incidental impurity elements is preferably 500 ppm or less, and more preferably 300 ppm or less. It is noted that such an incidental impurity can be present in a state where it adsorbs/adheres to the surface of a gold powder particle in some cases, and can be present in a state where it is reacted/alloyed with the gold powder in other cases.

(B) Production Method for Gold Powder of the Present Invention

As described above, the gold powder of the present invention contains a cyanide ion in the prescribed range with the content of a chloride ion suppressed. This gold powder can be produced by adding, to a conventional production method for a gold powder, a step of performing a treatment with a cyanide solution. Specifically, the production method for a gold powder of the present invention includes a step of producing, by a wet reduction method, a gold powder containing gold having a purity of 99.9% by mass or more and having an average particle size of 0.01 µm or more and 1.0 µm or less; and a step of reducing a chloride ion content by contacting the gold powder with a cyanide solution.

As described above, the wet reduction method is a method basically including a step of depositing a metal (gold) by adding a reducing agent to a solution of a metal (gold) compound. As the basis of the gold powder of the present invention, the gold powder contains a submicron order gold particle having an average particle size of 0.01 µm or more and 1.0 µm or less, and a method by which the particle size can be adjusted to fall within this particle size range is preferred. Therefore, the gold powder is produced preferably by a wet reduction method including a step of adjusting the particle size by supplying a reducing agent and a gold compound solution to a solution in which gold ultrafine particles are dispersed as nuclear particles for depositing gold on the surface of the nuclear particles (Patent Document 8). As the gold compound solution used in this wet reduction method, a chloroauric acid solution is preferred. This is because this solution is industrially inexpensive and stable. The gold compound solution contains a chloride ion. In the production process for the gold powder by employing this wet reduction method, conventionally employed conditions and steps are applied, and none of these are not specified in the present invention. The gold powder produced by the wet reduction method may be washed in advance with an appropriate solvent to reduce a content of impurities such as a chloride ion to some extent.

Then, the gold powder thus produced is contacted with a cyanide solution to reduce the content of a chloride ion. In this treatment, the cyanide solution dissolves a surface of the gold powder to remove a chloride ion together with a minimum amount of gold, and adds a cyanide ion to the gold powder. In this treatment, the cyanide solution can be a solution of potassium cyanide, sodium cyanide or the like. A cyanide ion concentration in this cyanide solution is preferably 0.01% by mass or more and 5% by mass or less. If the concentration is less than 0.01% by mass, it is difficult to promote the solution of the surface of the gold powder, and it takes time to reduce the content of a chloride ion. If the concentration is over 5% by mass, a dissolution speed of the gold powder is so high that it is difficult to obtain a gold powder having a particle size falling within the desired range.

In the present invention, the content of a cyanide ion needs to fall within the prescribed range. The content of a cyanide ion is adjusted depending on a cyanide ion concentration in the cyanide solution, and a treatment time. The treatment time with the cyanide solution depends on the amount of the gold powder, and is preferably 1 minute or more and 1 hour or less in using the solution having the above-described cyanide ion concentration.

Through the treatment of the gold powder with the cyanide solution, the gold powder of the present invention is produced. The gold powder obtained after the treatment with the cyanide solution may be washed. For the washing, a solvent such as water or an alcohol can be used.

(C) Gold Paste Using Gold Powder of the Present Invention

When the gold powder of the present invention is used for bonding/sealing/forming an electrode or the like, the gold powder is usually formed into a paste. The gold paste is formed by dispersing the gold powder in an organic solvent.

(i) Solvent of Gold Paste

A solvent in which the gold powder is dispersed is an organic solvent. Since an organic solvent is easily volatilized and vaporized by heating, a resultant bonding portion can be in a clean state. An organic solvent having a boiling point of 200 to 400° C. (under atmospheric pressure) is preferred. If the boiling point of an organic solvent is less than 200° C., an evaporation rate is so high that metal particles may agglomerate, and the organic solvent is difficult to handle because it may volatilize at a stage where the paste is applied. On the other hand, an organic solvent having a boiling point over 400° C. may remain in a bonding portion even after heating.

As specific examples of the organic solvent usable in the present invention, branched saturated aliphatic dihydric alcohols and monoterpene alcohols are preferred. More specifically, as the branched saturated aliphatic dihydric alcohols, propylene glycol, 1,2-butanediol, 1,3-butanediol, 1,2-pentanediol, 1,3-pentanediol, 1,4-pentanediol, 1,5-pentanediol, 2,3-pentanediol, 2,4-pentanediol, 1,2-hexanediol, 1,3-hexanediol, 1,4-hexanediol, 1,5-hexanediol, 1,6-hexanediol, 2,4-diethyl-1,5-pentanediol, and derivatives of these can be used. As the monoterpene alcohols, citronellol, geraniol, nerol, menthol, terpineol ($\alpha$, $\beta$), carveol, twill alcohol, pinocampheol, $\beta$-phentyl alcohol, dimethyloctanol, hydroxycitronellol, 2,4-diethyl-1,5-pentanediol, trimethyl-pentanediol monoisobutyrate, and derivatives of these can be used. Besides, a compound obtained by a condensation reaction between monovalent carboxylic acid and polyhydric alcohol is also effective, and examples include triethylene glycol di-2-ethylhexanoate, and triethylene glycol di-2-ethylbutanoate. Since the boiling point of an organic solvent is liable to depend on the number of carbon atoms, a solvent to be applied preferably has the number of carbon atoms of 5 to 20. From this point of view, the organic solvent may be an aromatic hydrocarbon, and for example, alkylbenzene can be used without causing any functional problem.

One type organic solvent may be singly applied as the organic solvent, or a mixture of two or more organic solvents respectively having different boiling points may be applied. When the organic solvent contains solvents respectively having a low boiling point and a high boiling point, the content of a metal particle can be easily adjusted by removing, through volatilization, the organic solvent having a lower boiling point in a treatment for adjusting the content.

(ii) Content of Gold Powder in Gold Paste

A content of the gold powder in the gold paste is preferably 80 to 99% by mass in terms of mass (based on the mass of the whole paste). When the content is less than 80% by mass, a void is formed during temperature increase, and hence a bonding portion in a suitable boning state is difficult to obtain. When the content is over 99% by mass, agglomeration of the gold powder may occur in some cases. The content of the gold powder is more preferably 82 to 98% by mass.

(iii) Suitable Physical Properties of Gold Paste

As described in the prior art document (Patent Document 7), one of bases for determining applicability of a metal paste is a thixotropy index value (TI value). A TI value is calculated with a ratio between viscosities respectively measured at two rotation speeds of different shear rates. In the present invention, a TI value calculated based on a ratio ($V_4/V_{40}$) between a viscosity ($V_{40}$) measured with a rotational viscometer at a measurement temperature of 23° C. at a shear rate of 40/s and a viscosity ($V_4$) measured at a shear rate 4/s is preferably 6.0 or more. The TI value can be controlled in accordance with the content of the gold powder in the metal paste, and a suitable TI value can be obtained by setting the content of the gold powder to the above-described suitable range.

(iv) Another Structure of Gold Paste

The metal paste may further contain an additive. As the additive, one or more selected from the group consisting of an acrylic-based resin, a cellulose-based resin, and an alkyd resin may be contained. When such a resin is further added, agglomeration of the gold powder in the paste is prevented, and hence a more homogeneous bonding portion can be formed. An example of the acrylic-based resin includes a methyl methacrylate polymer, an example of the cellulose-based resin includes ethyl cellulose, and an example of the alkyd resin includes a phthalic anhydride resin. Among these, ethyl cellulose is particularly preferred.

(D) Various Uses of Gold Powder of the Present Invention

As described above, the gold powder of the present invention is effective in various uses such as bonding, sealing, and forming an electrode/wire in an electric/electronic field and the like. When the gold powder of the present invention is provided for such a use, the gold powder is applied, in the form of the above-described gold paste, to a target of bonding or the like. Then, the gold paste is heated in accordance with the use to form a gold powder sintered body. The gold powder sintered body forms a medium or an electrode/wire for bonding/sealing. Now, specific examples of the uses in which the gold powder of the present invention can effectively work will be described.

(D-1) Use for Bonding

The gold powder and the gold paste of the present invention are useful for a method for boding a pair of boning members. In this bonding method, the applied gold paste is used directly as a bonding medium in one aspect, and the gold paste is formed into a metal powder sintered body to be used as the bonding medium in another aspect.

The bonding method in which the applied gold paste is directly used as a bonding medium is a method for bonding a pair of bonding members including the following steps.

(a) A step of applying a gold paste containing the gold powder of the present invention and an organic solvent to one bonding member.

(b) A step of overlapping the one bonding member on the other bonding member via the applied metal paste, and heating at least the metal paste at a temperature of 80° C. or more and 300° C. or less for bonding the pair of bonding members.

On the other hand, the bonding method in which the metal powder sintered body is used as a bonding medium is a method for bonding a pair of bonding members including the following steps.

(a) A step of applying a gold paste containing the gold powder of the present invention and an organic solvent to one bonding member.

(b) A step of sintering the gold paste at a temperature of 80 to 300° C. to obtain a metal powder sintered body.

(c) A step of overlapping the one bonding member on the other bonding member via the metal powder sintered body thus obtained, and heating at least the metal powder sintered body and applying a pressure in one direction or both directions for bonding.

(D-2) Use for Sealing

The gold powder and the gold paste of the present invention are useful also for a sealing method. In the sealing method, the gold paste having been applied is formed into a metal powder sintered body to be used as a sealing medium. The sealing method using the gold powder of the present invention is a sealing method for bonding a base material holding a content thereon to a lid body for the base material including the following steps.

(a) A step of applying, to a base material or a lid body, a metal paste containing the gold powder of the present invention and an organic solvent.

(b) A step of sintering the metal paste at a temperature of 80 to 300° C. to obtain a metal powder sintered body.

(c) A step of overlapping the base material on the lid body via the metal powder sintered body, and bonding the base material and the lid body to each other by applying a pressure in one direction or both directions under heating at least the metal powder sintered body.

(D-3) Use for Forming Electrode or Wire

Besides, the gold powder and the gold paste of the present invention is useful also for a method for forming an electrode or a wire on a substrate. In this method for forming an electrode/wire, the gold paste having been applied is formed into a metal powder sintered body to be used for forming an electrode/wire to be produced. The method for forming an electrode or a wire using the gold powder of the present invention is a method for forming an electrode or a wire on a substrate including the following steps.

(a) A step of applying a metal paste containing the gold powder of the present invention and an organic solvent to a substrate.

(b) A step of sintering the metal paste at a temperature of 80 to 300° C. to form an electrode or a wire containing a metal powder sintered body.

As described so far, the respective uses of the gold powder of the present invention can be distinguished depending on whether or not a sintering step is performed after applying the gold paste containing the gold powder. Therefore, the respective uses of the present invention will be described dividedly as use not including the sintering step (a bonding method) and as use including the sintering step (a bonding method, a sealing method, or a method for forming an electrode/wire).

(I) Use Not Including Sintering Step (Bonding Method)

(I-i) Step of Applying Gold Paste

In a step of applying a gold paste in this bonding method, a shape, a dimension and a structure of a target, that is, a bonding member to which the gold paste is applied, are not especially limited but those according with purposes are applied. A method for applying the gold paste is not especially limited, and any of various methods, such as a spin coating method, a screen printing method, an inkjet method, and a method for spreading, with a spatula or the like, the paste having been dropped, can be employed in accordance with the size, the shape and the like of the target. It is noted that a thin film of gold or another metal may be formed on a surface of the bonding member.

(I-ii) Bonding Step

After the applying step, one bonding member is overlapped on the other bonding member via the applied metal paste, and the resultant is heated for bonding. This heating is a treatment for removing, by volatilization, a solvent contained in the gold paste as well as for forming a rigid bonding portion by sintering the gold powder. In the heat treatment, at least the metal paste is heated at a temperature of 80° C. or more and 300° C. or less. Here, a part or the whole of the bonding members may be heated.

In the bonding step, a pressure may be applied to the bonding members under heating. After overlapping one bonding member on the other bonding member, a pressure can be applied for bonding in one direction or both directions to the pair of bonding members. Through the pressure application, the gold powder is densified through rigid bond while plastically deformed, and thus, bond strength can be increased. The pressure applied here is preferably 1 MPa to 10 MPa if it is applied for purposes of improving a contact state between a bonding interface and a gold particle, and is preferably 20 MPa or more and 10 MPa or less if it is applied for densifying the bonding portion.

(II) Use Not Including Sintering Step (Bonding Method, Sealing Method, or Method for Forming Electrode/wire)

(II-i) Step of Applying Gold Paste

Also when the sintering step is included, a step of applying a gold paste is performed in the same manner as in the bonding method not including the sintering step. A shape, a dimension and a structure of a target, that is, a bonding member, a base material, a lid body, or a substrate to which the gold paste is applied, are not especially limited but those according with purposes are applied. A thin film of gold or another metal may be formed on the base material or the substrate. A resist for forming an electrode/wire pattern may have been applied. A method for applying the gold paste is not especially limited, and any of various methods, such as a spin coating method, a screen printing method, an inkjet method, and a method for spreading, with a spatula or the like, the paste having been dropped, can be employed in accordance with the size, the shape and the like of the target.

After applying the gold paste, a drying treatment may be performed if necessary. When a drying treatment is performed in advance before the sintering step described below to remove, by volatilization, the organic solvent from the gold paste having been applied, and to increase the content of a gold particle, the sintering can be caused to suitably proceed. For the drying treatment, a method for heating the gold paste for volatilization can be employed. Here, as for a heating temperature, the heating is preferably performed at room temperature or higher and lower than 80° C. for 1 minute or more and 60 minutes or less. Alternatively, by utilizing volatility of the organic solvent, the drying treatment can be performed by putting the gold paste in a reduced pressure atmosphere. Here, an ambient pressure is set preferably to 0.1 kPa to 70 kPa, and a holding time is preferably 1 to 60 minutes. The drying step is, however, not an essential step, but the sintering step may be performed immediately after applying the paste.

(ii) Step of Sintering Gold Paste

The applied gold paste is heated for sintering the gold powder to obtain a metal powder sintered body. A heating temperature employed in this step is 80 to 300° C. When the temperature is lower than 80° C., point contact/bond among metal particles is weak. When the temperature is over 300° C., bond among the metal particles excessively proceeds to cause gold powder particles to be rigidly bonded to one another through necking, and the resultant is too hard. Besides, when the heating is performed at a temperature over 300° C., deformation and thermal effect of a base material, a substrate or the like are liable to occur. A heating time employed in the sintering step is preferably 10 minutes or more and 120 minutes or less. As for the atmosphere, the sintering step may be performed in the air, or may be performed in a vacuum atmosphere or an inert gas atmosphere. The sintering step is performed with no pressure applied.

Through the sintering step, the metal powder sintered body in which the gold powder particles are bonded to one another is formed. In forming an electrode (bump)/wire, the metal powder sintered body can be used as the electrode (bump)/wire. Alternatively, in a bonding method or a sealing method, the metal powder sintered body is used as a medium for performing bonding or sealing.

(iii) Pressure Application Step for Metal Powder Sintered Body (Bonding Method or Sealing Method)

A pressure application step is a step for performing bonding with improving a contact state between a bonding interface and a gold particle contained in the metal powder sintered body. Besides, by applying a pressure, the bonding can be performed with gold particles densified through rigid bond while plastically deformed. A degree of pressure application can be set in accordance with bond strength required in a bonding portion or a sealing property. Through these actions, a rigid bonding portion or a sealing portion excellent in airtightness is formed. In the pressure application step, the bonding member, the base material or the like on which the gold paste has been applied is overlapped on the other bonding member, base material or the like for applying a pressure. The pressure to be applied is preferably 1 MPa or more and 100 MPa or less. In particular, when the pressure is applied for purposes of improving a contact state between a bond interface and a gold particle, the pressure is preferably 11VIPa or more and 10 MPa or less, and when the pressure is applied for purposes of densifying a bonding portion, the pressure is preferably 20 MPa or more and 100 MPa or less. Besides, the pressure may be applied in one direction through either of the bonding members, or may be performed in both directions.

In the pressure application, it is necessary to apply the pressure under heating the metal powder sintered body. If the heating is not performed, the resultant bonding portion is insufficiently densified, and hence bond strength is inadequate. A heating temperature here is 80 to 300° C. If the heating temperature is lower than 80° C., the resultant bond is weak, and if the heating temperature is over 300° C., influence of thermal strain caused in cooling is large. Besides, in consideration of low-temperature packaging, the temperature is more preferably 250° C. or lower, and further preferably 200° C. or lower. Through this pressure application step, metal particles contained in the gold paste are moved and bonded, and thus, a rigid bonding portion/sealing portion is formed.

The uses of the gold powder of the present invention (the bonding method, the sealing method, and the method for forming an electrode/wire) described above are intended to present basic conditions in the respective uses. In the step of applying a gold paste, the sintering step, and the pressure application step, conditions excluding the above-described essential conditions can be appropriately set. Besides, the present invention is applicable to various uses of the conventional gold powders (Patent Documents 1 to 6) described above, and in these uses, a shape of a bonding member or a sealing member can be appropriately set, and the present invention is applicable also to production of a transferring substrate.

Advantageous Effects of Invention

As described above, in a submicron order gold powder containing gold of the present invention, a content of an impurity (chloride ion) is not simply reduced, but a suitable impurity of a cyanide ion is selected to set a suitable content thereof under recognition of an action of an impurity as a protective agent. Thus, agglomeration otherwise caused in forming a gold powder into a paste is inhibited, and influence of an impurity otherwise caused in setting a bonding condition to a low temperature is avoided. According to the gold powder of the present invention, bonding, sealing and electrode formation can be performed in consideration of low-temperature packaging.

DETAILED DESCRIPTION OF THE PREFERRED EMBODIMENTS

First Embodiment: An embodiment of the present invention will now be described. In the present embodiment, a gold powder in which contents of a chloride ion and a cyanide ion were respectively adjusted was produced. Then, an agglomerating property of each gold powder was studied to examine suitable contents of the impurities. For producing a gold powder of the present embodiment, a gold powder was produced by a wet reduction method, and the resultant gold powder was treated with a cyanide solution.

[Production of Gold Powder]

A beaker was charged with 1 L of pure water, and was heated on a hot plate up to 81° C. When the pure water was heated to 81° C., 3 g of alkylamine acetic acid was added thereto, and the resultant was stirred with the temperature kept until the solution became clear. After the stirring, 0.2 g of hydroxylammonium chloride was added to the resultant solution, followed by stirring for 1 minute. Then, a chloroauric acid solution (corresponding to 0.04 g of gold) was added thereto, the resultant was stirred for 1 hour with the solution temperature kept at 80±2° C., and thus, a violet transparent gold colloidal solution was obtained. A gold nuclear fine particle thus obtained was observed with a transmission electron microscope, resulting in finding that an average particle size was within a range of 10 nm to 50 nm.

To the gold colloidal solution, 2 L of a chloroauric acid solution was added for adjusting the particle size. This chloroauric acid solution was obtained by dissolving, in aqua regia, 200 g of gold bullion having a purity of 99.99% by mass or more. After adding the chloroauric acid solution, 200 g of hydroxylammonium chloride used as a reducing agent was added thereto, the resultant was stirred for 0.5 hours with the solution temperature kept at 80±2° C., and thus, 200 g of a gold powder was produced. The gold powder was filtered out, immersed in 1 L of isopropyl alcohol (IPA), and washed by stirring for 30 minutes.

The high purity gold powder (having a purity of 99.99% by mass) produced by the above-described wet reduction method was treated with a cyanide solution. 200 g of the washed gold powder was transferred to a cyanide solution obtained by dissolving 0.5 to 5 g of potassium cyanide in 1 L of pure water, the resultant was stirred at room temperature for 1 minute to 30 minutes, and thereafter, the gold powder was caused to settle, and a supernatant was collected. Thus, a chloride ion was removed from the gold powder, and a cyanide ion was imparted thereto.

After the treatment with the cyanide solution, the resultant gold powder was washed by repeating immersion in 1 L of IPA and stirring several times, and thus, the gold powder of the present embodiment was produced. The gold powder thus produced was observed with a scanning electron microscope (SEM) (5000×) to measure an average particle size. The average particle size of the gold powder of the present embodiment was 0.3 μm.

In the present embodiment, in the treatment with the cyanide solution, a cyanide concentration in the solution and a stirring time were adjusted to produce a plurality of types of gold powders different in a chloride ion concentration and the content of a cyanide ion. Besides, some of the gold powders thus produced were used for producing gold powders in which the content of a cyanide ion was adjusted by increasing the number of times of performing the washing after the treatment with the cyanide solution.

[Measurement of Chloride Ion Content]

Each of the gold powders of the present embodiment thus produced was measured for a chloride ion content. The measurement of the chloride ion content was performed by a heat desorption method. The gold powder was collected and weighed to be heated to 900° C. in a combustion tube, and a gas thus generated was caused to be absorbed by an adsorbing liquid (a mixture of 25 mL of a hydrogen peroxide solution and 15 mL of ultrapure water). The resultant absorption liquid was analyzed with an ion chromatograph to measure a chlorine amount (4), and a chorine amount (μg/g (ppm)) per unit mass of the collected gold powder (g) was defined as a chloride ion content in the gold powder. A minimum limit of determination is 10 μg/g. The measurement of the chloride ion content was performed on a gold powder prior to the treatment with the cyanide solution in the production process (washed gold powder obtained immediately after wet reduction), and on a gold powder obtained after the production (gold powder obtained after the final washing). Besides, the measurement was also performed on a gold powder not subjected to the treatment with the cyanide solution.

[Measurement of Cyanide Ion Content]

Each of the gold powders obtained after the treatment with the cyanide solution produced as described above was measured for a cyanide ion content. The measurement of the cyanide ion content was also performed by the heat desorption method. The operation was substantially the same as that described above, but for a cyanide ion, heating was performed at a temperature of 300° C. for 4 hours to generate a gas. Besides, quantitative determination of a cyanide ion in an absorption liquid was measured by ion chromatography-post column absorptiometry. Then, based on a cyanide amount (μg) in the absorption liquid, a cyanide amount (μg/g (ppm)) per unit mass of the collected gold powder (g) was defined as a cyanide ion content in the gold powder. A minimum limit of determination is 5 μg/g.

Particle sizes, the chloride ion contents, and the cyanide ion contents of the various gold powders produced in the present embodiment were as follows:

TABLE 1

| No. | Treatment with Cyanide Compound | Chloride Ion (ppm) | Cyanide Ion (ppm) |
|---|---|---|---|
| 1 | not performed | 200 | 0 |
| 2 |  | 100 | 0 |
| 3 | performed | 98 | 6 |
| 4 |  | 90 | 20 |
| 5 |  | 55 | 105 |
| 6 |  | 20 | 500 |

TABLE 1-continued

| No. | Treatment with Cyanide Compound | Chloride Ion (ppm) | Cyanide Ion (ppm) |
|---|---|---|---|
| 7 |  | 10 | 800 |
| 8 |  | 18 | 200 |
| 9 |  | 12 | 100 |

\* Gold Powder No. 1 is a gold powder produced by performing the washing only once after the wet reduction.
\* Gold Powder No. 2 is a gold powder obtained by washing Gold Powder No. 1 further twice to reduce the chloride ion content.
\* Gold Powders Nos. 3 to 7 are gold powders in which the chloride ion and cyanide ion contents were adjusted by adjusting a concentration of the cyanide solution and the stirring time.
\* Gold Powders Nos. 8 and 9 are gold powders obtained by washing Gold Powder No. 6 further twice or three times to adjust mainly the cyanide ion content.

Next, each of the gold powders thus produced was evaluated for the agglomerating property. In this examination, 10 g of the gold powder was put in 100 mL of IPA, and ultrasonic vibration was applied with an ultrasonic cleaner to a beaker holding the resultant solution to obtain a homogeneous suspension. Here, after confirming that a reddish brown suspension was obtained, and that the suspension was homogeneous, the ultrasonic cleaner was stopped. Thus, the gold powder settled, and the color was faded from an upper layer of the suspension. In the present embodiment, a time until a settled deposit was piled up to a 25 mL marked line of the beaker (which time is designated as the settle time) was measured. A gold powder having a high agglomerating property has a large apparent particle size because of agglomeration, and hence settles faster, and the settle time is shorter. Therefore, the settle time was used as an index of the agglomerating property. Measurement results of the settle time are shown in Table 2.

TABLE 2

| No. | Chloride Ion (ppm) | Cyanide Ion (ppm) | Settling Time (min) |
|---|---|---|---|
| 1 | 200 | 0 | 80 |
| 2 | 100 | 0 | 40 |
| 3 | 98 | 6 | 45 |
| 4 | 90 | 20 | 75 |
| 5 | 55 | 105 | 105 |
| 6 | 20 | 500 | 115 |
| 7 | 10 | 800 | 120 or more |
| 8 | 18 | 200 | 110 |
| 9 | 12 | 100 | 90 |

In the gold powder (No. 1) washed once after the production by the wet reduction method, the chloride ion content was 200 ppm. This gold powder was a gold powder in which the settle time was long and the agglomerating property was low owing to the high chloride ion content. It was confirmed, in the gold powder (No. 2) obtained by washing the former gold powder to reduce the chloride ion content to 100 ppm or less, that the settling time was largely shorter, and that the agglomerating property was increased. In all the gold powders No. 3 to No. 9 in which a cyanide ion was added with the chloride ion content reduced, the settling time was longer than that of the gold powder No. 2, and thus, the effect of inhibiting the agglomerating property derived from a cyanide ion was found. In the gold powder (No. 3) in which the cyanide ion content was less than 10 ppm, however, the settling time was not largely different from that of the gold powder No. 2, and it is presumed that a cyanide ion should be added in an amount of about 10 ppm. Besides, it is presumed that the gold powders in each of which a total of the chloride ion content and the cyanide ion content is 110 ppm or more (No. 4 to No. 9) are particularly effective gold powders.

Second Embodiment (Bonding Method): In this embodiment, the gold powders produced in the first embodiment were used to produce a gold paste. Then, a demonstration test of bonding process for an electronic member using the gold paste thus produced was performed.

For obtaining the gold pastes, three gold powders (purity: 99.99% by weight, average particle size: 0.3 μm) of the gold powders Nos. 1, 4 and 6 of the first embodiment were used. Each of these gold powders was mixed with an organic solvent, an ester alcohol (2,2,4-trimethyl-3-hydroxypentaisobutyrate ($C_{12}H_{24}O_3$)) to prepare a gold paste. A blending ratio of the organic solvent was 5% by weight.

In the present embodiment, a Ni plate was bonded to a semiconductor (Si) chip as an electronic member. On the semiconductor chip, a film of Au (0.3 μm)/Pt (0.1 μm)/Ti (0.05 μm) was formed by a deposition method. Besides, a film of Au (1 μm)/Pd (1 μm) was formed on the Ni substrate by a plating method.

First, the gold paste was applied to the semiconductor chip (application area: 4 mm$^2$). After the application, the Ni plate was placed on the semiconductor chip, and then, bonding was performed by heating the resultant to 200° C. and keeping the resultant for 20 minutes with no pressure applied.

The above-described bonding step was performed using each of the various gold powders (gold pastes), and soundness of a bonding portion of each semiconductor chip was evaluated. In this evaluation test, the semiconductor chip was heated in vacuum to 200° C., and air released from a heating furnace was contacted with an absorption liquid to check whether or not chlorine or cyanogen was detected. Detection of chlorine or cyanogen means that an impurity gas was released from the bonding portion.

As a result of this test, it was confirmed that an impurity gas was not released from the bonding portions formed from the gold powder No. 4 (chloride ion content: 90 ppm, cyanide ion content: 20 ppm) and the gold powder No. 6 (chloride ion content: 20 ppm, cyanide ion content: 500 ppm). On the other hand, it was confirmed that a very small amount of chlorine was detected in using the gold powder No. 1 (chloride ion content: 200 ppm, cyanide ion content: 0 ppm). A bonding temperature employed in the bonding test of the present embodiment was set to a relatively low temperature of 200° C. In using the gold powder No. 1, it is presumed that a chloride ion remained in the bonding portion in employing this bonding temperature. On the other hand, in using the gold powders No. 4 and No. 6, the chloride ion content was reduced, and hence a chloride ion was unlikely to remain. In using the gold powder No. 6, although the cyanide ion content is high, it is presumed that many cyanide ions had been released during drying and sintering process performed after the application of the gold paste, and hence a cyanide ion little affected the bonding step.

Third Embodiment (Sealing Method): In this embodiment, a gold paste was produced from a gold powder produced by changing production conditions for the gold powder (No. 6) produced in the first embodiment. Then, the gold paste thus produced was used to hermetically seal a package for an electronic component.

Gold powders used here are three gold powders, that is, the gold powder No. 6 of the first embodiment, and two gold powders having different particle sizes produced by partly changing the production conditions employed in the first embodiment. The gold powder produced in the present embodiment was produced by changing, in the wet reduction method of the first embodiment, the amount of the chloroauric acid solution to be added to a gold colloidal solution of a nuclear ultrafine particle to 1/10 or 10 times. Then, the treatment with the cyanide solution was performed under the same conditions as those for the gold powder No. 6. These gold powders (No. 10 and No. 11) respectively had average particle sizes of 0.1 μm (No. 10) and 0.5 μm (No. 11). These gold powders were measured for the chloride ion content and the cyanide ion content in the same manner as in the first embodiment (and the results will be described later).

In the present embodiment, a gold paste was produced by employing the same solvent and conditions as those employed in the second embodiment to attempt hermetical sealing of a package. This package was a package used in a piezoelectric device package or the like, and included a base member of alumina ceramics (dimension: 2.5 mm×2.0 mm), and a cap member (cover member) of kovar. On both of these members, a Au (1 μm)/Pd (1 μm)/Ni (1 μm) plating film was formed.

In a sealing operation, the gold paste was applied, by a photoresist method, to a frame-shaped region with a width of 20 μm along the four sides of the cap member. After applying the gold paste, a resist was removed, the cap member was heated in an electric furnace at 230° C. for 30 minutes to sinter the gold paste, and thus, a metal powder sintered body to be used as a sealant was formed.

Next, the cap member having been subjected to the sintering step was placed on and bonded to the base member. The bonding of the cap member was performed by placing the package on a heat stage placed in a vacuum atmosphere ($1\times10^{-1}$ Pa) with the package kept at a set bonding temperature (200° C.) through heat transfer from the stage, and applying a load of 10 N (100 MPa) through the cap member. In this sealing step, a heating and pressure applying time was 10 minutes.

After the sealing step, the package was subjected to a helium leak test (bell jar method) to check soundness of a sealing portion. In this evaluation, a helium leak rate of $10^{-9}$ Pa·m³/s or less was determined as acceptable. Results of the test are shown in Table 3.

TABLE 3

| No. | Gold Powder Particle Size (μm) | Chloride Ion (ppm) | Cyanide Ion (ppm) | Sealing Test Result Leak Rate (Pa·m³/s) | Determination |
|---|---|---|---|---|---|
| 6 | 0.3 | 20 | 500 | $10^{-11}$-$10^{-12}$ | Acceptable |
| 10 | 0.1 | 15 | 400 | $10^{-11}$-$10^{-12}$ | Acceptable |
| 11 | 0.5 | 30 | 550 | $10^{-11}$-$10^{-12}$ | Acceptable |

It was confirmed, based on Table 3, that the gold powders used in the present embodiment are useful for package sealing. It was found that although the cyanide ion content is relatively high, the cyanide ion content does not affect the gold powders of the present embodiment. Even when the bonding temperature in sealing is 200° C., the gold powder of the present embodiment can form an effective sealing portion.

INDUSTRIAL APPLICABILITY

A gold powder of the present invention is inhibited from agglomerating when formed into a paste with a harmful influence derived from a chloride ion reduced. In the present invention, an action, like that of a protective agent, of an impurity contained in a gold powder is recognized, and a cyanide ion is specified as a suitable impurity, and a suitable content thereof is set. The gold powder of the present invention is applicable to low-temperature packaging, and is useful for uses for bonding, sealing, and forming an electrode/wire in various applications to electronic components, semiconductor devices, power devices, MEMSs and the like.

What is claimed is:

1. A gold powder comprising gold having a purity of 99.9% by mass or more and having an average particle size of 0.01 μm or more and 1.0 μm or less,
    wherein a content of a chloride ion in the gold powder is 10 ppm or more and 100 ppm or less,
    a content of a cyanide ion in the gold powder is 10 ppm or more and 1000 ppm or less, and a combined content of the chloride ion and the cyanide ion in the gold powder is 110 ppm or more and 1000 ppm or less.

2. The gold powder according to claim 1, wherein the content of the cyanide ion is 100 ppm or more and 1000 ppm or less.

3. A gold paste, comprising the gold powder defined in claim 1, and an organic solvent.

4. A gold paste, comprising the gold powder defined in claim 2, and an organic solvent.

5. A production method for the gold powder defined in claim 1, comprising:
    a step of producing, by a wet reduction method, a gold powder comprising gold having a purity of 99.9% by mass or more and having an average particle size of 0.01 μm or more and 1.0 μm or less; and
    a step of reducing the content of a chloride ion by contacting the gold powder with a cyanide solution.

6. The production method for the gold powder according to claim 5, wherein a cyanide ion concentration in the cyanide solution is 0.01% by mass or more and 5% by mass or less.

7. A production method for the gold powder defined in claim 2, comprising:
    a step of producing, by a wet reduction method, a gold powder comprising gold having a purity of 99.9% by mass or more and having an average particle size of 0.01 μm or more and 1.0 μm or less; and
    a step of reducing the content of a chloride ion by contacting the gold powder with a cyanide solution.

8. A method for bonding a pair of bonding members to each other, comprising:
    (a) a step of applying, to one bonding member, a gold paste comprising the gold powder defined in claim 1 and an organic solvent; and
    (b) a step of overlapping the one bonding member and another bonding member on each other via the applied gold paste, and heating at least the gold paste at a temperature of 80° C. or more and 300° C. or less for bonding the pair of bonding members to each other.

9. The bonding method according to claim 8, comprising overlapping the one bonding member and the other bonding member on each other, and subsequently applying a pressure for bonding to the pair of bonding members in one or more directions under heating.

10. A method for bonding a pair of bonding members to each other, comprising:
    (a) a step of applying, to one bonding member, a gold paste comprising the gold powder defined in claim 1, and an organic solvent;

(b) a step of sintering the gold paste at a temperature of 80 to 300° C. to obtain a metal powder sintered body; and (c) a step of overlapping the one bonding member on another bonding member via the formed metal powder sintered body, and heating at least the metal powder sintered body and applying a pressure in one or more directions for bonding.

11. A method for bonding a base material holding a content thereon to a lid body for the base material, comprising:

(a) a step of applying, to the base material or the lid body, a gold paste comprising the gold powder defined in claim 1 and an organic solvent;

(b) a step of sintering the gold paste at a temperature of 80 to 300° C. to obtain a metal powder sintered body; and (c) a step of overlapping the base material on the lid body via the metal powder sintered body, and bonding the base material and the lid body to each other by applying a pressure in one or more directions under heating at least the metal powder sintered body.

12. An electrode or wire forming method for forming an electrode or a wire on a substrate, comprising:

(a) a step of applying, to the substrate, a gold paste comprising the gold powder according to the claim 1, and an organic solvent; and (b) a step of sintering the gold paste at a temperature of 80 to 300° C. to form an electrode or a wire containing a metal powder sintered body.

13. A method for bonding a pair of bonding members to each other, comprising:

(a) a step of applying, to one bonding member, a gold paste comprising the gold powder defined in claim 2 and an organic solvent; and (b) a step of overlapping the one bonding member and another bonding member on each other via the applied gold paste, and heating at least the gold paste at a temperature of 80° C. or more and 300° C. or less for bonding the pair of bonding members to each other.

14. A method for bonding a pair of bonding members to each other, comprising:

(a) a step of applying, to one bonding member, a gold paste comprising the gold powder defined in claim 2, and an organic solvent;

(b) a step of sintering the gold paste at a temperature of 80 to 300° C. to obtain a metal powder sintered body; and (c) a step of overlapping the one bonding member on another bonding member via the formed metal powder sintered body, and heating at least the metal powder sintered body and applying a pressure in one or more directions for bonding.

* * * * *